United States Patent [19]

Murase et al.

[11] Patent Number: 4,521,794

[45] Date of Patent: Jun. 4, 1985

[54] ELECTRODE AND SEMICONDUCTOR DEVICE PROVIDED WITH THE ELECTRODE

[75] Inventors: Katsumi Murase, Iruma; Yoshihiko Mizushima, Tokyo, both of Japan

[73] Assignee: Nippon Telegraph & Telephone Public Corporation, Tokyo, Japan

[21] Appl. No.: 626,487

[22] Filed: Jul. 3, 1984

Related U.S. Application Data

[63] Continuation of Ser. No. 304,983, Sep. 23, 1981, abandoned.

[30] Foreign Application Priority Data

Sep. 30, 1980 [JP] Japan ................................ 55-137108
Oct. 3, 1980 [JP] Japan ................................ 55-137674

[51] Int. Cl.$^3$ ............................................. H01L 45/00
[52] U.S. Cl. .......................................... 357/2; 357/67; 357/65; 357/59; 357/15; 357/63
[58] Field of Search ................... 357/2, 4, 59, 67, 65, 357/15, 63

[56] References Cited

U.S. PATENT DOCUMENTS

| | | | |
|---|---|---|---|
| 3,496,027 | 2/1970 | Dingwall et al. | 357/87 X |
| 3,510,364 | 5/1970 | Oesterhelt et al. | 357/87 X |
| 4,301,323 | 11/1981 | Schink | 357/63 X |
| 4,342,044 | 7/1982 | Ovshinsky et al. | 357/2 |

FOREIGN PATENT DOCUMENTS 53-139470 12/1978 Japan ..................................... 357/59

OTHER PUBLICATIONS

Friederich et al., "Doping Effect in CVD Deposited Amorphous Silicon: A Study by Light-Induced ESR", Proc. 15th Int. Conf. Physics of Semiconductors, Kyoto (1980); J. Phys. Soc. Japan, vol. 49, (1980), Suppl. A, pp. 1233–1236.

Hall et al., "Preparation and Properties of Boron-Doped Silicon Films Grown at Low Temperature by Chemical Vapor Deposition" Thin Solid Films, vol. 18, pp. 145–155, (1978).

Spear et al., "Electronic Properties of Substitutionally Doped Amorphous Si and Ge", Philosophical Mag., vol. 33, No. 6, (1976), pp. 935–949.

*Primary Examiner*—Martin H. Edlow
*Attorney, Agent, or Firm*—Frishauf, Holtz, Goodman and Woodward

[57] ABSTRACT

A semiconductor layer is formed on at least one portion of a silicon substrate. The layer is made of poly-crystalline or amorphous multicomponent containing silicon, at least one element of Group IV having an atomic radius larger than that of silicon, such as germanium or tin, and donor impurity or acceptor impurity.

9 Claims, 7 Drawing Figures

ELECTRODE AND SEMICONDUCTOR DEVICE PROVIDED WITH THE ELECTRODE

This application is a continuation of application Ser. No. 304,983, filed Sept. 23, 1981, abandoned.

BACKGROUND OF THE INVENTION

This invention relates to an electrode made of multi-component layer having a low resistivity and providing ohmic contact or rectifying contact and also to a semiconductor device provided with the electrode.

FIG. 1 shows a known semiconductor device with an electrode. The device comprises a single-crystalline silicon substrate 1, an n-type or p-type single-crystalline silicon layer 3 formed in the substrate 1, and a p-type or n-type semiconductor layer 4 formed in the layer 3 and having a resistivity much lower than that of the layer 3. The upper surfaces of the layers 3 and 4 are flush with a major surface 2 of the substrate 1. An insulating layer 5 is formed on the entire surface of the structure, except for a part of the semiconductor layer 4. Further an interconnection layer 6 is formed on the insulating layer 5 and said part of the semiconductor layer 4.

The semiconductor layer 4, which lies between the single-crystalline silicon layer 3 and the interconnection layer 6, is an electrode or contact layer. That is, the layer 4 transfers electric charge between the layers 3 and 6 in a specific manner to operate the semiconductor device. If the layers 3 and 4 have the same conduction type, n-type or p-type, the layer 3 is ohmically connected to the interconnection layer 6 through the semiconductor layer 4. If the layers 3 and 4 are of different conduction types, they provide the semiconductor device with rectifying property.

The semiconductor layer 4 should have a low resistivity, when it connects the substrate 1 and the layer 3 ohmically, or when it is used as, for example, the emitter of a transistor, to connect the substrate 1 and the layer 3 with rectifying property. If the resistivity of the layer 4 is low, power loss in the layer 4 due to a voltage drop will be reduced, the delay of a signal passing through the layer 4 will be shortened, and emitter injection efficiency will be enhanced.

Conventionally, the layer 4 is formed by diffusing or ion-implanting donor or acceptor impurity into the single-crystalline silicon layer 3. Annealing process follows ion-implantation. To form the layer 4 in this way, a thermal treatment at high temperatures about 900° C. is usually necessary. The treatment is likely to cause defects in the silicon substrate 1 and the single-crystalline silicon layer 3 and to promote the contamination of the semiconductor device, thus possibly degrading the performance of the device. To make the matter worse, during the treatment the donor or acceptor impurity diffuses from the layer 4, inevitably changing both the structure and electrical characteristics of the semiconductor device. This makes device design difficult and complicated. The high temperature thermal treatment has further disadvantages such as limitation of materials to be used and high production cost.

Moreover, since the semiconductor layer 4 is formed in the single-crystalline silicon layer 3 as shown in FIG. 1, the layer 3 must be made so large that the layer 4 may have a sufficient volume. This means that the semiconductor device as a whole has to be large.

It has been proposed that the semiconductor layer 4 be made of poly-crystalline silicon or amorphous silicon. This is because these material require but a low temperature process. However, poly-crystalline silicon and amorphous silicon have an extremely high resistivity. Their use is thus limited.

P-type poly-crystalline silicon available at present has a resistivity of $2 \times 10^{-3}$ $\Omega$·cm at the least as disclosed in "Thin Solid Films, 18 (1973) 145–155", page 152, FIG. 12. N-type amorphous silicon made by the known CVD (chemical-vapor-deposition) method has a resistivity of 10 $\Omega$·cm at the least, as stated in "J. Phys. Soc. Japan 49 (1980) Suppl. A pp. 1233-1236", page 1234, FIG. 1. P-type and n-type amorphous silicons formed by the glow-discharge technique have also a high resistivity. Their resistivity is 100 $\Omega$·cm at the least, as disclosed in "Philosophical Magazine, 1976, Vol. 33, No. 6, pp. 935–949", page 940, FIG. 3.

If a semiconductor device is made of poly-crystalline silicon or amorphous silicon, both having a high resistivity, a long delay time and a large voltage drop are unavoidable. The device will therefore operate at a low speed and consumes much power.

Accordingly an electrode and a semiconductor device with an electrode have long been desired, the electrode being made of material which has a low resistivity and which makes it possible to manufacture the device by a low temperature process.

SUMMARY OF THE INVENTION

It is an object of this invention to provide an electrode and a semiconductor device with the electrode, using a novel material which has a low resistivity and which can be made by a low temperature process.

An electrode according to the invention is a multi-component layer made of silicon, at least one element of Group IV having an atomic radius larger than that of silicon and an impurity determining the conductivity type of the layer. A semiconductor device according to the invention comprises a semiconductor substrate and a layer formed on the substrate and made of silicon, at least one element of Group IV having an atomic radius larger than that of silicon and an impurity determing the conductivity type of the layer.

More specifically, the layer of this invention is poly-crystalline or amorphous. The layer can therefore be formed by a low temperature process and can yet have a low resistivity since it contains, besides silicon, the impurity and germanium, tin or other element of Group IV. The electrode made of the layer and the semiconductor device provided with the electrode can operate at a high speed, consuming a little power.

DETAILED DESCRIPTION OF THE PREFERRED EMBODIMENTS

Figure 1:
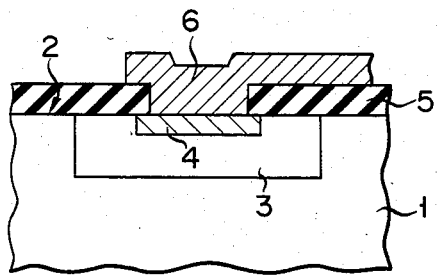
FIG. 1 is a sectional view of a part of a known semiconductor device provided with an electrode.
Figure 2:
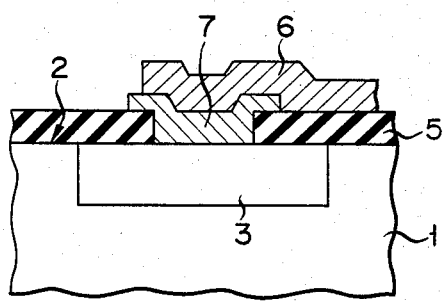
FIG. 2 is a sectional view of a part of a semiconductor device with an electrode according to this invention.

Referring to FIG. 2, an embodiment of the invention will be described. An electrode according to the invention is used in, for example, such a semiconductor device as shown in FIG. 2. The device comprises a single-crystalline silicon substrate 1 and a p-type or n-type single-crystalline silicon layer 3 formed in the substrate 1, with its top surface flush with the major surface 2 of the substrate 1. Further, the layer 3 may be formed on the whole surface of the substrate 1. On the substrate 1 and the layer 3 an insulating layer 5 is formed, leaving a portion of the layer 3 exposed. Further, a layer 7 is formed partly on the exposed portion of the layer 3 and partly on the insulating layer 5. An interconnection layer 6 is formed partly on the insulating layer 5 and partly on the layer 7.

The layer 7 is a poly-crystalline or amorphous layer composed of silicon, at least one element of Group IV such as germanium or tin and donor impurity such as phosphorus or arsenic. Alternatively, it is a polycrystalline or amorphous layer composed of silicon at least one element of Group IV such as germanium or tin and at least one acceptor impurity such as boron or gallium. The layer 7 may be formed in the following manner.

If the layer 7 is a poly-crystalline layer of silicon, germanium and boron, it is formed by CVD method at 500° C. to less than 900° C., using a gas mixture consisting of silane, germane, diborane and hydrogen. If the layer 7 is a poly-crystalline layer of silicon, germanium and phosphorus, it is formed by CVD method at 500° C. to less than 900° C., using a gas mixture consisting of silane, phosphine, germane and hydrogen. If the layer 7 is an amorphous layer of silicon, germanium and boron, it is formed by CVD method at 600° C. or less, using a gas mixture consisting of silane, germane, diborane and hydrogen. Further, if the layer 7 is an amorphous layer of silicon, germanium and phosphorus, it is formed by CVD method at 600° C. or less, using a gas mixture consisting of silane, phosphine, germane and hydrogen. Instead of the CVD method, the glow-discharge technique may be used to form the layer 7.

If the layer 7 has the same conduction type as the single-crystalline silicon layer 3, it contacts the layer 3, forming an ohmic contact, no matter in whichever method it has been formed. In this case, the layer 7 connects the single-crystalline silicon layer 3 ohmically to the interconnection layer 6. If the layer 7 has the conduction type opposite to that of the layer 3, it contacts the layers 3, forming a pn junction. In this case, the layer 7 connects the single-crystalline silicon layer 3 and the interconnection layer 6 and rectifies the current flowing between them.

To form the layer 7 in any method mentioned above, a thermal process is not necessarily be carried out at 900° C. or more, as in forming the known semiconductor layers. In addition, the layer 7 has a low resistivity. As evident from FIG. 4, the layer 7, which is deposited at 500° C., has a resistivity lower than that of the known semiconductor layers, whether it is amorphous or poly-crystalline.

Figure 4:
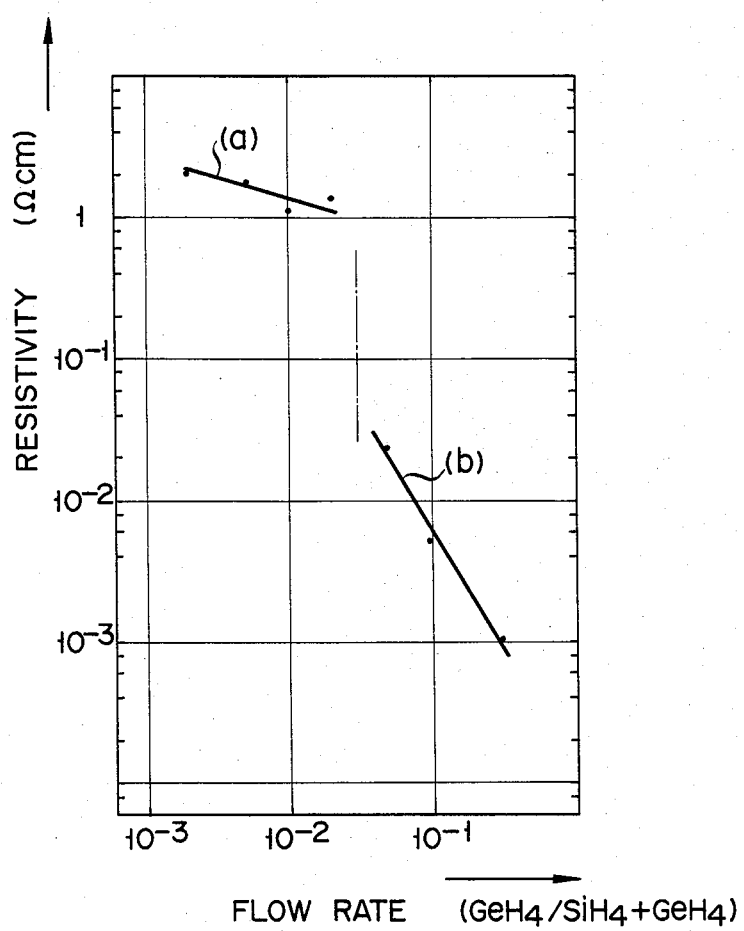
FIG. 4 is a graph showing the resistivities of layers which are used in a semiconductor device with an electrode according to this invention.

In FIG. 4, plotted on the vertical axis are resistivities of layers according to this invention, which are composed of silicon, germanium and boron. Plotted on the horizontal axis is the ratio of flow rate of germane to the sum of flow rates of germane and silane. The ratio of flow rate of diborane to the sum of flow rates of germane and silane is kept to 1 percent. The layers are formed at 500° C. Line a indicates the relationship between the resistivity of each layer with amorphous structure and the ratio of flow rate, $(GeH_4)/(SiH_4+GeH_4)$, and line b indicates the relationship between the resistivity of each layer with polycrystalline structure and the ratio of flow rate, $(GeH_4)/(SiH_4+GeH_4)$.

As line a shows, the resistivity of the layer with amorphous structure is reduced to about 1 $\Omega$·cm. As line b shows, the resistivity of the layer with polycrystalline structure is reduced to about $10^{-3}$ $\Omega$·cm. Obviously, the layer according to this invention has a resistivity lower than the known semiconductor layer, no matter whether it is amorphous or poly-crystalline.

The element of Group IV used is not limited to germanium. Other element of Group IV such as tin may be used so long as its atomic radius is larger than that of silicon, since it can reduce strain caused in the network of silicon and boron while maintaining $SP^3$ type atomic bond. Two elements such as germanium and tin of Group IV may be used.

Figure 3:
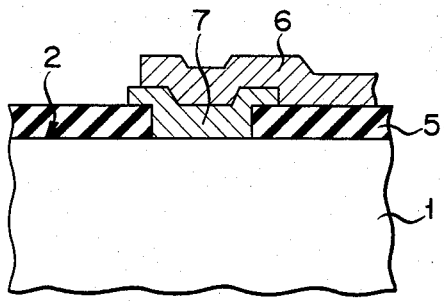
FIG. 3 is a sectional view of a part of another semiconductor device with an electrode according to this invention.

A semiconductor device, having such an electrode as shown in FIG. 2 or 3, can be manufactured by a low temperature process and can operate with a high efficiency. If the layer 7 is an amorphous layer and contacts the single-crystalline silicon layer 3 forming pn junction and if the layer 7 and the layer 3 are used as the emitter and base of a transistor, respectively, minority carriers will be injected into the layer 3 from the layer 7 with a much higher efficiency than possible in the known transistor. This is because the layer has a low resistivity and also because the layer 7 becomes a wide gap emitter. Hence, the semiconductor device of FIG. 2 or 3 can be made into a transistor of a high efficiency.

The single-crystalline layer 3 may be formed not directly in the silicon substrate 1. It may be formed in another semiconductor layer which is formed in the substrate 1. Alternatively, no single-crystalline layer may be formed as shown in FIG. 3. In this case the layer 7 is put in direct contact with the silicon substrate 1. Further, the substrate 1 may be formed of other material than single-crystal silicon; it may be formed of poly-crystalline silicon or amorphous silicon.

Now another embodiment of the present invention will be described with reference to FIG. 5.

Figure 5:
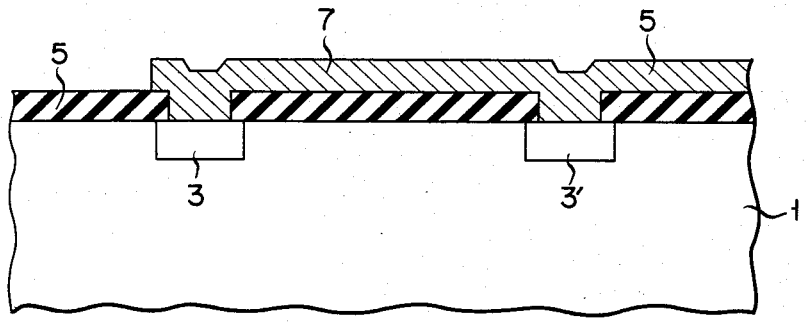
FIG. 5 is a sectional view of a part of another semiconductor devic with an electrode according to the invention.

As shown in FIG. 5, two single-crystalline silicon layers 3 and 3' are formed in a silicon substrate 1, spaced from each other at a predetermined distance. The layers 3 and 3' are of the same conductivity type, either of p-type or of n-type. They have their upper surfaces flush with a major surface of the substrate 1. On the substrate 1 and the layers 3 and 3' an insulating layer 5 is formed, leaving a portion of the layer 3 and a portion of the layer 3' exposed. A layer 7 is formed on the insulating layer 5 and both single-crystal silicon layers 3 and 3'. The layer 7 is an electrode which has so a low a resistivity that it functions not only as a contact but also as in interconnection layer. An example of this configuration is such that the layer 7 and the layers 3 and 3' form the emitter-base junctions of transistors and the emitters are connected each other. In this case, the layer 7 is formed, by varying germanium content, to have amorphous structure in the portion which contacts with the layer 3 and 3' and polycrystalline structure in the other portion. Then, the layer 7 works as an electrode which can function not only as an emitter with high emitter efficiency but also as an interconnection layer of low resistivity. The layer 7 may be of multicomponent with hydrogen in addition to silicon, at least one element of Group IV having an atomic radius larger than that of silicon and at least one impurity for determining the conduction type of the layer 7. Then, the layer 7, whether a polycrystalline layer or an amorphous layer, will have a low density of localized states in the energy gap originating from dangling bonds.

As evident from the embodiments of FIGS. 2, 3 and 5, the electrode, or the layer 7, functions not only as, a contact but also as an interconnection layer. The electrode is therefore one of the important elements of the device.

Now it will be described how to manufacture solar batteries, using the above-described layer formed on the silicon substrate and having a low resistivity.

Figure 6:
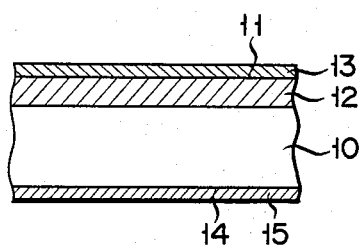
FIG. 6 is a sectional view of a solar battery to which this invention is applied.

To manufacture such a solar battery as shown in FIG. 6, an n-type single-crystalline silicon substrate 10, for example, is washed with, for instance, hydrogen chloride gas in a CVD envelope. Then, a p-type layer 12 is formed on the substrate 10 by the CVD method at 600° C. or less, using a gas mixture of silane ($SiH_4$), diborane ($B_2H_6$), germane ($GeH_4$) and hydrogen or helium. The layer 12 thus formed is a p-type amorphous layer. Alternatively, the p-type amorphous silicon layer 12 may be formed by the glow-discharge technique at 200° C. to 400° C., using a gas mixture consisting of silane ($SiH_4$), diborane ($B_2H_6$), germane ($GeH_4$) and hydrogen. If use is made of a gas mixture of silane, diborane, germane and hydrogen, the layer 12 will have a low density of localized states in the energy gap originating from dangling bonds. Finally, an ohmic electrode 13 is formed on the p-type multicomponent layer 12, and another ohmic electrode 15 is formed on the other major surface 14 of the n-type single-crystalline silicon substrate 10.

Figure 7:
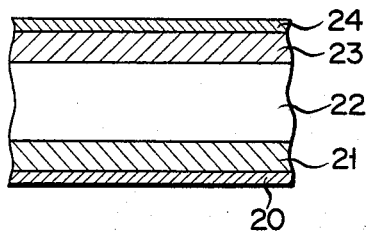
FIG. 7 is a sectional view of another solar battery to which this invention is applied.

To manufacture such a solar battery as illustrated in FIG. 7, an n-type amorphous silicon layer 21 is formed on a substrate 20 made of stainless steel, which functions as an electrode as well. The layer 21 is formed, by for example, the glow-discharge technique at 200° C. to 400° C., using a gas mixture of silane ($SiH_4$), phosphine ($PH_4$) and hydrogen, until it grows to have a desired thickness. Then, an i-type amorphous silicon layer 22 is formed on the n-type amorphous silicon layer 20, using a gas mixture of silane ($SiH_4$) and hydrogen. Further, a p-type amorphous layer 23 is deposited on the i-type amorphous silicon laeyr 22, using a gas mixture of silane ($SiH_4$), diborane ($B_2H_6$), germane ($GeH_4$) and hydrogen. Finally an ohmic electrode 24 is laid on the p-type amorphous multicomponent layer 23.

A gas mixture containing germane ($GeH_4$) may be used not only to form the p-type amorphous layer 23 but also to form the n-type amorphous layer 21 and the i-type amorphous layer 22, provided that the content of germane is adjusted to a proper value. If this method is used, both the n-type amorphous layer 21 and the p-type amorphous layer 23 can have a resistivity far lower than possible with the known methods. By changing the germanium content of the layers 21 and 23, the energy gap between these layers 21 and 23 can be varied. Hence, the absorption edge of the solar battery may vary over a specific range. As a result, the battery can absorb light over a broad range of wavelength and its light absorption efficiency is high.

In both the solar battery of p-n structure (FIG. 6) and the solar battery of p-i-n structure (FIG. 7), the region in the p-type layer which performs photoelectric energy conversion consists of that portion of the p-type layer which contacts the n-type layer or the i-type silicon layer and which is therefore a depletion layer and that portion of the p-type layer which extends from the edge of the depletion layer for a distance equal to the diffusion length of electrons (i.e. minority carriers). The other portions of the p-type layer do not contribute to photoelectric energy conversion and are thus unnecessary. Further, a loss of power due to these portions is considerably large if the resistivity of the p-type layer is relatively high. Since the p-type layer according to this invention has a low resistivity, the solar battery according to this embodiment can have a high operation efficiency.

To demonstrate that p-type amorphous multicomponent layer composed of silicon, boron and germanium (i.e. element of Group IV) has a resistivity lower than that of p-type amorphous silicon which contains only boron, the following experiment was conducted.

P-type amorphous silicon containing only boron was formed at 550° C., using a gas mixture of silane ($SiH_4$), diborane ($B_2H_6$), helium and hydrogen under pressure of 0.2 Torr., the ratio of flow rate of digorane to that of silane being 0.1. Then, p-type amorphous multicomponent layer according to this invention, which contains silicon, germanium and boron was formed at 550° C., using a gas mixture of silane ($SiH_4$), diborane ($B_2H_6$), germane ($GeH_4$), helium and hydrogen under pressure of 0.2 Torr., the ratio of flow rate of diborane to that of silane being 0.5. The p-type amorphous silicon containing only boron was found to have a resistivity of 15 $\Omega \cdot cm$. The p-type amorphous multicomponent layer according to this invention was found to have a far lower resistivity of 1.8 $\Omega \cdot cm$.

Addition of germanium to silicon is to form multicomponent layer advantageous in another respect. Germanium, if contained in silicon containing boron, surpresses strain in silicon which is caused by addition of boron in a large amount. That is, germanium helps to provide a solar battery of p-n structure or p-i-n structure which is mechanically stable, too.

What we claim is:

1. An electrode arrangement comprising an amorphous silicon electrode layer disposed on a substrate, said electrode layer consisting essentially of (i) amorphous silicon, (ii) one element of Group IV selected from the group consisting of germanium and tin, and (iii) boron.

2. A semiconductor device comprising a semiconductor substrate and an electrode layer formed on the substrate, said electrode layer being an amorphous silicon consisting essentially of (i) amorphous silicon, (ii) one element of Group IV selected from the group consisting of germanium and tin, and (iii) boron.

3. The semiconductor device according to claim 2, wherein said semiconductor substrate and said electrode layer are of the same conductivity type and forms an ohmic contact.

4. The semiconductor device according to claim 2, wherein said semiconductor substrate and said electrode layer are of different conductivity types and and have rectifying characteristics.

5. The electrode arrangement according to claim 1 or 2, wherein said element of Group IV is germanium.

6. The electrode arrangement according to claim 1 or 2, wherein said element of Group IV is tin.

7. The electrode arrangement accordiing to claim 2, wherein said substrate is a single crystalline silicon substrate.

8. The electrode arrangement according to claim 2, wherein said substrate is a polycrystalline silicon substrate.

9. The electrode arrangement according to claim 2, wherein said substrate is an amorphous silicon substrate.

* * * * *